United States Patent
Sim

(10) Patent No.: US 9,531,354 B1
(45) Date of Patent: Dec. 27, 2016

(54) TRUE RANDOM NUMBER GENERATOR

(71) Applicant: SK hynix memory solutions inc., San Jose, CA (US)

(72) Inventor: Yukeun Sim, Santa Clara, CA (US)

(73) Assignee: SK hynix memory solutions Inc., San Jose, CA (US)

( * ) Notice: Subject to any disclaimer, the term of this patent is extended or adjusted under 35 U.S.C. 154(b) by 0 days.

(21) Appl. No.: 14/745,275

(22) Filed: Jun. 19, 2015

Related U.S. Application Data

(60) Provisional application No. 62/014,524, filed on Jun. 19, 2014, provisional application No. 62/107,257, filed on Jan. 23, 2015.

(51) Int. Cl.
*H03K 3/84* (2006.01)
*H03K 3/03* (2006.01)
*H03K 19/20* (2006.01)

(52) U.S. Cl.
CPC .............. *H03K 3/84* (2013.01); *H03K 3/0315* (2013.01); *H03K 19/20* (2013.01)

(58) Field of Classification Search
None
See application file for complete search history.

(56) References Cited

U.S. PATENT DOCUMENTS

| | | | |
|---|---|---|---|
| 8,410,857 B2 * | 4/2013 | Dichtl | G06F 7/588 331/57 |
| 9,335,972 B2 * | 5/2016 | Yang | G06F 7/588 |
| 2002/0126841 A1 | 9/2002 | Arai | |
| 2009/0077147 A1 | 3/2009 | Hars | |
| 2011/0163818 A1 * | 7/2011 | Dichtl | G06F 7/588 331/57 |

OTHER PUBLICATIONS

Yang et al., "A 23Mb/s 23pJ/b Fully Synthesized True-Random-Number Generator in 28nm and 65nm CMOS", IEEE International Solid-State Circuits Conference, 2014.

* cited by examiner

*Primary Examiner* — Long Nguyen
(74) *Attorney, Agent, or Firm* — IP & T Group LLP

(57) ABSTRACT

A random number generator is disclosed. In some embodiments, the random number generator comprises two cross-coupled inverter chains, wherein each inverter chain comprises an odd number of gates including an input NAND gate; wherein when a clock signal input into the NAND gate of both inverter chains switches from low to high, the inverter chains start toggling until a noise induced phase difference automatically collapses the toggling after a random number of cycles; and wherein a random number generated by the random number generator is based on the random number of cycles.

18 Claims, 2 Drawing Sheets

TRUE RANDOM NUMBER GENERATOR

CROSS REFERENCE TO OTHER APPLICATIONS

This application claims priority to U.S. Provisional Patent Application No. 62/014,524 entitled TRUE RANDOM NUMBER GENERATOR USING RANDOMLY AUTO-STOP TOGGLING MECHANISM TO EASE DESIGN COMPLEXITY filed Jun. 19, 2014 which is incorporated herein by reference for all purposes and also claims priority to U.S. Provisional Patent Application No. 62/107,257 entitled HIGH YIELD DIGITAL TRUE RANDOM NUMBER GENERATOR USING A FEEDFORWARD CAPACITOR filed Jan. 23, 2015 which is incorporated herein by reference for all purposes.

BACKGROUND OF THE INVENTION

Ring oscillator based true random number generators typically comprise complex circuitry (e.g., phase detectors, feedback engines, etc.) having large footprints. Thus, a need exists for a true random number generator that overcomes the shortcomings of existing solutions.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims, and the invention encompasses numerous alternatives, modifications, and equivalents. Numerous specific details are set forth in the following description in order to provide a thorough understanding of the invention. These details are provided for the purpose of example, and the invention may be practiced according to the claims without some or all of these specific details. For the purpose of clarity, technical material that is known in the technical fields related to the invention has not been described in detail so that the invention is not unnecessarily obscured.

A digital true random number generator based on a randomly auto-stop toggling mechanism is disclosed herein. The disclosed true random number generator architecture may be advantageously designed to consume very low power and occupy a very small area in CMOS integrated circuits.

High-level example circuit configurations are given in the figures and described in detail below to provide an explanation of the disclosed techniques for random number generation. However, the described techniques are not limited to these embodiments but rather may be achieved via any other appropriate circuit configurations that provide similar or equivalent functionality.

Figure 1A:
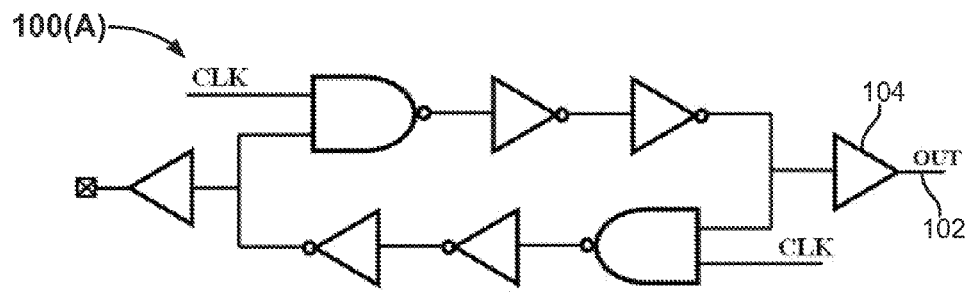
FIG. 1A illustrates an embodiment of a circuit comprising two cross-coupled ring oscillators.

FIG. 1A illustrates an embodiment of a circuit 100(A) comprising two cross-coupled ring oscillators. That is, circuit 100(A) comprises two inverter chains with the output of each chain fed into the input of the other. Each inverter chain or oscillator comprises an odd number of gates. Specifically, each inverter chain comprises one NAND gate and an even number of inverters. In the given example, each inverter chain comprises one NAND gate and two inverters. Both inverter chains are symmetrical. That is, both inverter chains are designed to have identical layouts and routing.

Because they are cross-coupled and symmetric, both inverter chains oscillate at exactly the same time under ideal conditions. When the clock signal input into the NAND gate of each inverter chain switches from low (zero) to high (one), each inverter chain initially starts toggling at the same speed or frequency. Due to noise in the operating environment, the phase difference between the two inverter chains gradually increases. Eventually, the skew between the two inverter chains collapses the toggling, and a single state is held. That is, output signal 102 remains at a constant value—low (zero) or high (one)—once toggling stops. The number of oscillations or cycles before the inverter chains collapse is unpredictable because the skew between the inverter chains results from uncorrelated noise. Thus, the inverter chains automatically stop toggling after a random number of cycles. This noise-induced randomness is translated into a true random number.

A reset occurs when the clock signal input into the NAND gate of each inverter chain goes low (zero). That is, output signal 102 is held at a constant value or state when the clock signal is low (zero). Circuit 100(A) may be designed such that the value of output signal 102 is either state when the clock signal is low (zero). If gate 104 comprises a buffer, output signal 102 is high (one) when the clock signal is low (zero). If gate 104 comprises an inverter, output signal 102 is low (zero) when the clock signal is low (zero).

Circuit 100(A) may be employed to generate one or more random bits in parallel. The output signal value or state at which toggling collapses comprises one random bit. To generate n parallel random bits, where n is an integer greater than zero, the number of cycles or oscillations before collapsing may be counted using an n-bit counter. The n bits of the counted value comprise n parallel random bits.

As described, the phase or time difference between the outputs of the two inverter chains is ideally zero when no noise sources exist. However, despite being designed symmetrically, the two inverter chains will in reality not be completely symmetric due to process variations. A mismatch between the inverter chains introduces a phase offset. If the phase offset introduced from mismatch significantly dominates the total phase offset due to mismatch and noise, the number of cycles before collapsing will be deterministic and not a true random number. In such cases, the collapsed value of output signal 102 will be severely biased towards either zero or one. In the worst case scenario, the two inverter chains stop toggling after a minimum number of cycles, m, wherein m is the total number of gates in each chain (e.g., three in circuit 100(A)). Thus, the number of cycles before collapsing during every input clock period is deterministic if the total phase offset is mainly due to mismatch. However, the number of cycles before collapsing during every input clock period is not deterministic if the total phase offset is mainly due to random noise sources such as thermal noise and flicker noise. Randomness can be improved by at least in part compensating for the phase offset due to mismatch so that the net phase offset and eventual collapsing is primarily due to random noise.

Figure 1B:
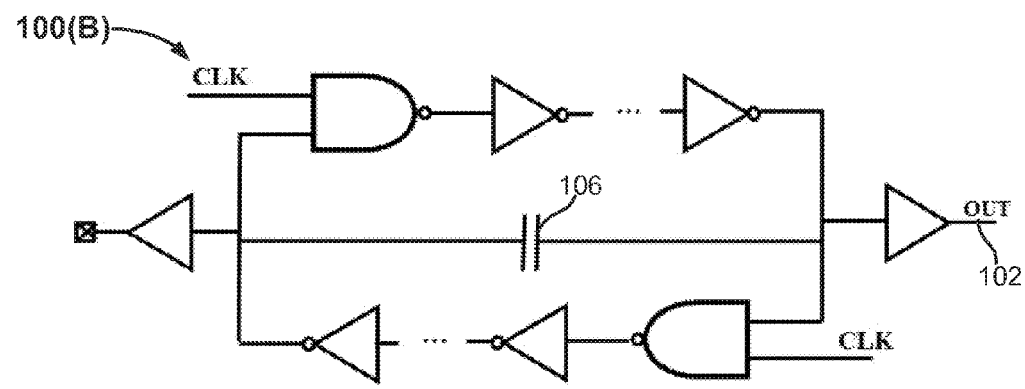
FIG. 1B illustrates an embodiment of a technique to compensate for phase offset.

FIG. 1B illustrates an embodiment of a technique to compensate for phase offset. As depicted, capacitor 106 is added in circuit 100(B) between the outputs of the two inverter chains. During a static state, capacitor 106 functions as a very large resistor and prevents any leakage current between the output nodes of the two inverter chains. During toggling, capacitor 106 provides a feed-forward path between the output nodes of the two inverter chains. Thus, capacitor 106 at least in part reduces the net phase offset and thus effectively at least in part compensates for deterministic phase offset due to mismatch. This compensation allows the phase offset due to noise to dominate the net phase offset. Capacitor 106 may also at least in part compensate for phase offset due to noise. The average number of cycles before collapsing increases with increasing capacitance values of capacitor 106. Eventually, the phase offset due to noise accumulates enough to collapse the toggling. Thus, accumulated noise, rather than mismatch, plays the main role in determining the number of cycles before collapsing and the value of output signal 102 when toggling collapses.

Figure 1C:
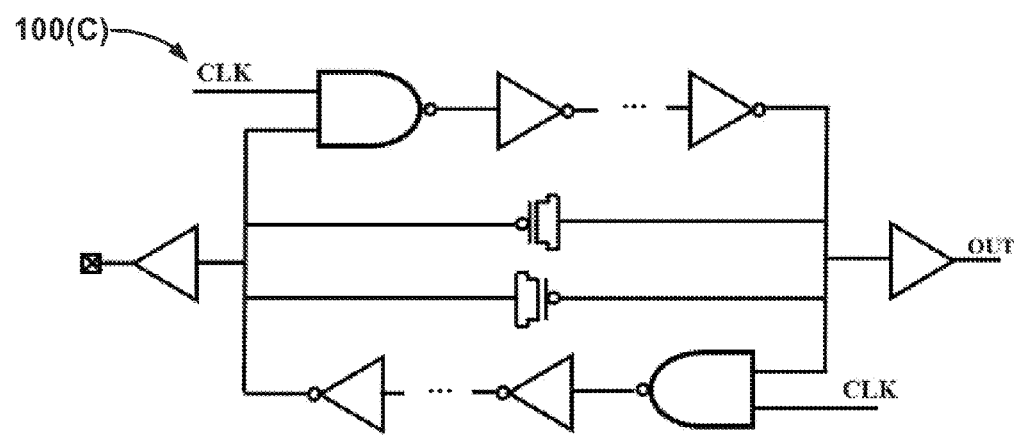
FIG. 1C illustrates an embodiment of a symmetric capacitor layout between the output nodes of the inverter chains.

FIG. 1C illustrates an embodiment of a symmetric capacitor layout in circuit 100(C) between the output nodes of the inverter chains. In the given example, capacitors are designed with PMOS transistors, e.g., in a separate n-well from other cells or in a deep n-well, so that leakage currents are prevented by tying the n-type body to its source and drain. Any capacitance value may be selected based on design considerations. Higher capacitance values result in more cycles before collapsing and more randomness but at the expense of more power consumption. In many applications, very small capacitors are sufficient to generate true random numbers at low power. In some embodiments, the capacitor size is selected based at least in part on the transistor size employed. Smaller transistors are characterized by greater mismatch, and thus larger capacitors may be needed for adequate compensation. Larger transistors are less mismatched, and thus smaller capacitors may be sufficient.

Figure 2:
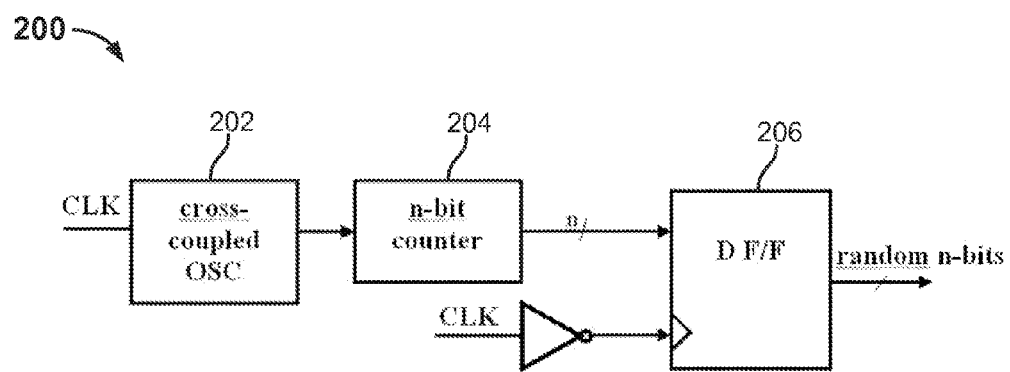
FIG. 2 is a high-level block diagram of an embodiment of a true random number generator system.

FIG. 2 is a high-level block diagram of an embodiment of a true random number generator system. As depicted, system 200 includes cross-coupled oscillator 202, n-bit counter 204, and flip-flop 206. For example, cross-coupled oscillator 202 may comprise any or any variation of circuits 100(A)-(C) of FIGS. 1A-1C. When the input clock signal goes high (one), the random number of cycles cross-coupled oscillator 202 oscillates before collapsing is accumulated to n-bits by counter 204. To ensure (true) randomness of the n-bits, counter 204 may be configured to count less than a minimum number of cycles that cross-coupled oscillator 202 is expected to oscillate. If n is too large, a few most significant bits of the counted value may be predictable, but one or more of the least significant bits are (true) random values. When the input clock signal goes low (zero), the n-bit counter value is latched into flip-flop 206. Thus, n parallel random bit streams may be generated from a plurality of consecutive clock pulses using system 200. Counter 204 may not be reset every input clock cycle since a random number added to a previous random number results in a random number. In embodiments in which the generation of only one random bit is needed, counter 204 may be omitted from system 200 since the output of cross-coupled oscillator 202 when it collapses comprises a random bit. In some embodiments, system 200 includes additional circuitry (not shown) that detects whether oscillator 202 collapses within each clock pulse, i.e., before the clock signal resets. If oscillator 202 does not collapse before the clock signal resets, such circuitry is in some embodiments configured to discard the generated bit(s).

The disclosed cross-coupled oscillator architecture consumes a relatively small area. Thus, multiple cross-coupled oscillators may be embedded in a single chip to increase yield. In some embodiments, system 200 comprises a plurality of cross-coupled oscillators such as cross coupled oscillator 202 that are operated serially or in parallel to generate a plurality of random numbers which are then combined (e.g., added) to generate the output random number. Each cross-coupled oscillator is uncorrelated with other cross-coupled oscillators. Thus, even if some of the plurality of cross-coupled oscillators fail due to unpredictable process variations, the total sum (or other mathematical combination) of cycles from all cross-coupled oscillators will be random if at least one does not fail. Such a redundant architecture significantly increases yield of the disclosed random number generator.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A random number generator, comprising:
inverter chains including a first inverter chain and
a second inverter chain cross-coupled to the first inverter chain; and
at least a capacitor connected between outputs of the inverter chains,
wherein each of the inverter chains comprises an odd number of gates including an input NAND gate; wherein when a clock signal input into the NAND gate of the inverter chains switches from low to high, the inverter chains start toggling until a noise induced phase difference automatically collapses the toggling after a random number of cycles; and wherein a random number generated by the random number generator is based on the random number of cycles.

2. The random number generator of claim 1, wherein the random number generator comprises a true random number generator.

3. The random number generator of claim 1, wherein the first and the second inverter chains comprise two cross-coupled ring oscillators.

4. The random number generator of claim 1, wherein the output of each inverter chain is input into the other inverter chain.

5. The random number generator of claim 1, wherein each inverter chain comprises an even number of inverters.

6. The random number generator of claim 1, wherein each inverter chain comprises two inverters.

7. The random number generator of claim 1, wherein both inverter chains are symmetric.

8. The random number generator of claim 1, wherein the random number generator is reset when the clock signal input into the NAND gate of both inverter chains goes low.

9. The random number generator of claim 1, further comprising symmetric capacitors connected between the outputs of the inverter chains.

10. The random number generator of claim 1, wherein the random number comprises a single random bit comprising an output value of the first inverter chain or the second inverter chain when toggling collapses.

11. The random number generator of claim 1, further comprising a counter configured to count n bits of the random number of cycles to generate n parallel random bits, wherein n is an integer greater than zero.

12. The random number generator of claim 11, wherein the counter is configured to count less than a minimum number of cycles the inverter chains are expected to oscillate.

13. The random number generator of claim 1, wherein the cross-coupled inverter chains comprise one of a plurality of cross-coupled inverter chains and wherein the random number is generated by combining outputs of the plurality of cross-coupled inverter chains.

14. A method, comprising:
configuring inverter chains including a first inverter chain and a second inverter chain;
cross-coupling the second inverter chain with the first inverter chain; and
connecting at lease a capacitor between outputs of the inverter chains,
wherein each of the inverter chains comprises an odd number of gates including an input NAND gate; wherein when a clock signal input into the NAND gate of the inverter chains switches from low to high, the inverter chains start toggling until a noise induced phase difference automatically collapses the toggling after a random number of cycles; and wherein a random number is generated based on the random number of cycles.

15. The method of claim 14, wherein the output of each inverter chain is input into the other inverter chain.

16. The method of claim 14, wherein each inverter chain comprises an even number of inverters.

17. The method of claim 14, wherein the random number comprises a single random bit comprising an output value of the first inverter chain or the second inverter chain when toggling collapses.

18. The method of claim 14, further comprising configuring a counter to count n bits of the random number of cycles to generate n parallel random bits, wherein n is an integer greater than zero.

\* \* \* \* \*